(12) United States Patent
Gunapala et al.

(10) Patent No.: US 7,211,820 B2
(45) Date of Patent: May 1, 2007

(54) QUANTUM WELL SENSOR HAVING SPATIALLY SEPARATED SENSING COLUMNS

(75) Inventors: Sarath D. Gunapala, Valencia, CA (US); Sumith V. Bandara, Valencia, CA (US); John K. Liu, Pasadena, CA (US); Daniel W. Wilson, Montrose, CA (US)

(73) Assignee: California Institute of Technology, Pasadena, CA (US)

( * ) Notice: Subject to any disclaimer, the term of this patent is extended or adjusted under 35 U.S.C. 154(b) by 120 days.

(21) Appl. No.: 09/924,209

(22) Filed: Aug. 7, 2001

(65) Prior Publication Data

US 2002/0008232 A1   Jan. 24, 2002

Related U.S. Application Data

(63) Continuation of application No. 09/443,177, filed on Nov. 19, 1999, now Pat. No. 6,271,537.

(60) Provisional application No. 60/109,329, filed on Nov. 20, 1998.

(51) Int. Cl.
*H01L 31/0352* (2006.01)
*H01L 31/05* (2006.01)
(52) U.S. Cl. .................. 257/21; 257/184; 257/436; 257/466
(58) Field of Classification Search ............. 257/21, 257/184, 436, 466
See application file for complete search history.

(56) References Cited

U.S. PATENT DOCUMENTS

| 5,198,659 A | | 3/1993 | Smith et al. |
| 5,384,469 A | * | 1/1995 | Choi ........................... 257/21 |
| 5,470,761 A | | 11/1995 | McKee et al. |
| 5,485,015 A | * | 1/1996 | Choi ........................... 257/21 |
| 5,528,051 A | | 6/1996 | Nuyen |
| 5,539,206 A | | 7/1996 | Schimert |
| 5,552,603 A | | 9/1996 | Stokes |
| 6,091,126 A | * | 7/2000 | Costard et al. ............. 257/431 |
| 6,184,538 B1 | * | 2/2001 | Bandara et al. ............. 257/21 |
| 6,271,537 B1 | * | 8/2001 | Gunapala et al. ........... 257/21 |
| 6,545,289 B1 | | 4/2003 | Gunapala et al. |

OTHER PUBLICATIONS

Chen et al., "Corrugated Quantum Well Infrared Photodetectors with Polyimide Planarization for Detector Array Applications," IEEE Transactions on Electron Devices, vol. 45, No. 7, Jul. 1998, pp. 1431-1437.*
Pan et al., "Normal incident infrared absorption from InGaAs/GaAs quantum dot superlattice," Electronics Letters, Aug. 29, 1996, vol. 32, No. 18, pp. 1726-1727.*
Pan et al., "Strong normal-incidence infrared absorption and photocurrent spectra from highly uniform (In,Ga)As/GaAs quantum dot structures," Electronics Letters, May 14, 1998, vol. 34, No. 10, pp. 1019-1020.*

(Continued)

*Primary Examiner*—Jerome Jackson
(74) *Attorney, Agent, or Firm*—Fish & Richardson P.C.

(57) ABSTRACT

Quantum-well sensors having an array of spatially separated quantum-well columns formed on a substrate. A grating can be formed increase the coupling efficiency.

11 Claims, 2 Drawing Sheets

OTHER PUBLICATIONS

Rokhinson et al., "Quantum grid infrared photodetectors," Feb. 1, 1999, Applied Physics Letters, vol. 74, No. 5, pp. 759-761.*

Gunapala, Sarath D. et al., "15-micrometer 128×128 GaAs/AlxGa1-xAs Quantum Well Infrared Photodetector Focal Plane Array Camera," IEEE Transactions on Electron Devices, vol. 44, No. 1, Jan. 1997, pp. 45-50.

Gunapala, Sarath D. et al., "9-micrometer 256×256 GaAs/AlxGa1-As Quantum Well Infrared Photodector Hand-Held Camera," IEEE Transactions on Electron Devices, vol. 44, No. 1, Jan. 1997, pp. 51-57.

Gunapala, Sarath D. et al., "Long-Wavelength 640×486 GaAs/AlxGa1-xAs Quantum Well Infrared Photodetector Snap-Shot Camera," IEEE Transactions on Electron Devices, vol. 45, No. 9, Sep. 1998, pp. 1890-1895.

* cited by examiner

QUANTUM WELL SENSOR HAVING SPATIALLY SEPARATED SENSING COLUMNS

CROSS-REFERENCE TO RELATED APPLICATIONS

This application is a continuation of U.S. application Ser. No. 09/443,177, filed Nov. 19, 1999, now U.S. Pat. No. 6,271,537 which claims priority from U.S. provisional application Serial No. 60/109,329, filed on Nov. 20, 1998.

ORIGIN

The devices and techniques described herein were made in the performance of work under a NASA contract, and are subject to the provisions of Public Law 96–517 (35 U.S.C. §202) in which the Contractor has elected to retain title.

BACKGROUND

This specification relates to quantum-well radiation sensors and techniques of constructing quantum-well radiation sensors with reduced noise.

An infrared quantum-well semiconductor sensor includes a quantum-well structure formed of alternating active and barrier semiconductor layers. Such a quantum-well structure can have different energy bands which each can have multiple quantum states. An intraband transition between a ground state and an excited state in the same band (i.e., a conduction band or a valance band) can be used to detect infrared ("IR") radiation by absorbing IR radiation at or near a selected resonance IR wavelength. Only incident radiation with a polarization that is perpendicular to the quantum well layers can be absorbed, because this polarization can induce an intraband transition. The absorption of the radiation generates electric charge indicative of the amount of received radiation. The radiation-induced charge can then be converted into an electrical signal (e.g., a voltage or current) to be processed by signal processing circuitry.

The total charge produced by an IR quantum-well sensor generally includes two major contributions. One is radiation-induced charge which indicates the amount of radiation being absorbed by the quantum-well layers. Another contribution is the charge that is not produced by absorption of radiation. Rather, such non-radiation-induced charge is caused by thermal effects, quantum tunneling effect, shot noise, and other fluctuation processes. The motion of certain non-radiation-induced charge under a bias electrical field generates an electrical current called the dark current. This dark current is undesirable since it does not reflect the amount of radiation to be detected. In addition, it can saturate the detection circuitry and hence adversely affect the detection of the radiation-induced signal.

SUMMARY

The present devices and techniques use an array of quantum-well columns of either one dimension or two dimensions formed on a substrate to couple incident radiation to have a polarization perpendicular to the quantum-well layers for intraband absorption and to reduce the dark current.

In one embodiment, a quantum-well semiconductor device includes a plurality of quantum-well columns spatially separated from one another by a gap which is electrically insulating and formed over a substrate to form a periodic array. Each quantum-well column includes, a first conductive contact layer formed over the substrate, a quantum-well stack having a plurality of alternating quantum-well layers parallel formed over the first conductive contact layer and operating to absorb radiation polarized perpendicularly to the quantum-well layers, and a second conductive contact layer formed over the quantum-well stack.

These and other features and associated advantages of the devices and techniques are described in detail in the following.

DETAILED DESCRIPTION

Figure 1:
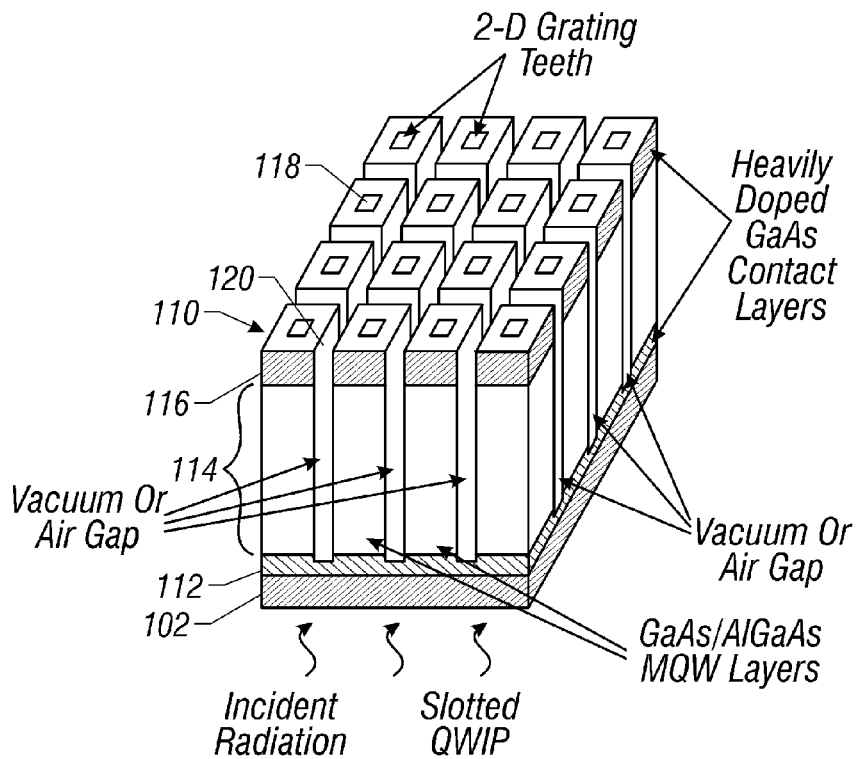
FIG. 1 shows on embodiment of a 2-dimensional slotted quantum-well sensor having quantum-well columns separated by low-index insulating gaps.

An intraband quantum-well sensor can be formed of an array of columnar shaped quantum-wells on a substrate. The columns can be arranged in a one dimensional array or in a two dimensional array. The columnar elements can be square, rectangular, round, elliptical or irregular in cross section each can be similarly shaped or they can be different. FIG. 1 shows one embodiment of such a "slotted" sensor 100 having a two-dimensional array of quantum-well columns 110 on a substrate 102. Any two adjacent quantum-well columns 110 are completely separated by a gap 120. Each quantum-well column 110 includes a first conductive contact layer 112 which is directly formed over the substrate 102, a quantum-well stack 114 of multiple alternating semiconductor layers (active and barrier layers) to absorb radiation at one or more wavelengths. The quantum-well layers are parallel to the surface of the substrate 102 and may include two or more stacks of different quantum well structures that have intraband transitions at different wavelengths to allow each column 110 to detect radiation of different colors. One or more columns 110 may be grouped together to form a single sensing pixel of a sensor array.

A second conductive contact layer 116 is directly formed over the quantum-well stack 114 so that the quantum-well stack 114 is sandwiched between the contact layers 112 and 116. Different electrical potentials are applied to the layers 112 and 116 to properly bias the quantum-well stack 114. Heavily-doped semiconductor materials (e.g., GaAs) may be used as the contact layers 112 and 114.

The gap 120 between adjacent columns 110 is formed by removing quantum-well layers and other layers above the substrate 102 by, e.g., etching. The gap 120 may be etched slightly into the substrate 102 to ensure complete separation between any two adjacent columns 110. The gap 120 is electrically insulating and may be filled with vacuum, air, or an insulating material. The index of refraction of the gap 120 is less than that of each quantum-well column 110. Hence, each column 110 is an independent sensor which is electrically isolated from other columns.

Different columns 110, however, are not completely separated in their optical properties. The array of the columns 110 is a periodic structure and hence can be collectively used to construct a two-dimensional optical grating. This grating can be used to couple a portion of the incident radiation into each quantum-well column 110 with a polarization perpendicular to the quantum-well layers. It has been discovered that the coupling efficiency of this grating can be increased by forming a metallic grating tooth 118 on top of each quantum-well column 110. The grating tooth 118 may be a square layer formed of gold, for example.

Figure 2:
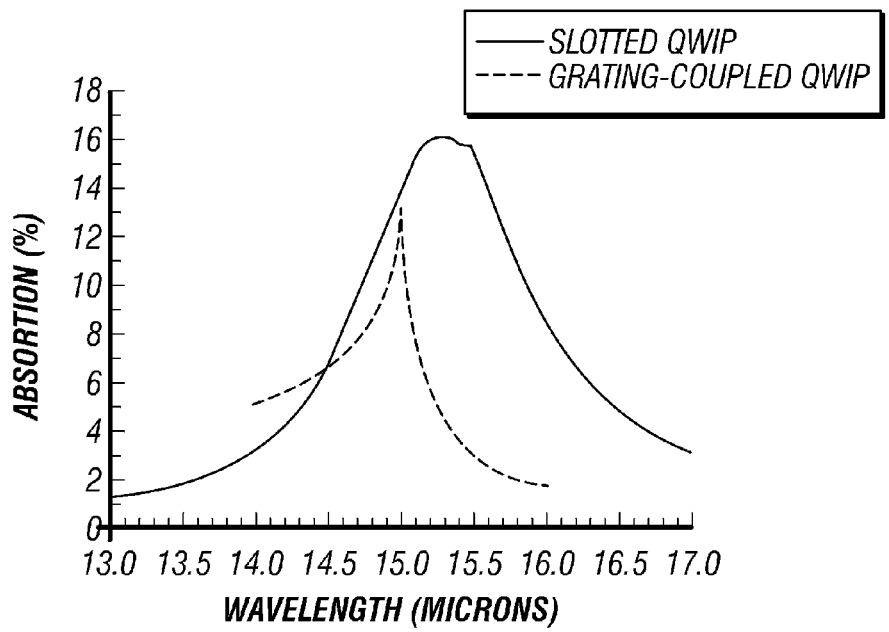
FIG. 2 shows calculated absorption spectra of a slotted quantum-well sensor and a conventional grating-coupled quantum-well sensor without slots. The calculation is based on a coupled wave analysis by using the same level of anisotropic absorption: $n_x=3.1$, $n_z=3.1-j(\alpha_z \lambda/4\pi)$, $\alpha_z = 84$ cm$^{-1}$.

In addition, this array of columns 110 is optically different from a conventional diffraction grating. Its bandwidth is broader, to allow detection of different wavelengths within its bandwidth. FIG. 2 compares the absorption bandwidths of a grating-coupled quantum-well sensor without slots and a slotted quantum-well sensor.

Each quantum-well column 110 also functions as an optical cavity with its side walls forming its reflective surfaces. Since the refractive index of the quantum-well column 110 is selected to be greater than that of the gap 120, certain rays entering the column 110 from the substrate 102 may undergo one or more total internal reflections. In this sense, each quantum-well column 110 is also a waveguide. Hence, the actual interaction length is increased. The absorption by the quantum-well layers is correspondingly increased. This further increases the coupling efficiency of the device 100. Certain parameters of each column 110, including column width, gap width, and gap index, are adjusted to achieve a resonance condition of the optical cavity, to increase the magnitude of the electric field perpendicular to the quantum-well layers and therefore the coupling efficiency. Measurements also indicate that these quantum-well columns 110 exhibit weak optical coupling to a certain extent.

Another feature of the slotted quantum-well sensor 100 is its reduced dark current. The dark current is approximately proportional to the dimension of the cross section (i.e., the square root of the area) of the quantum-well region in a quantum-well sensor. The presence of the gap 120 between adjacent quantum-well columns 110 reduces the cross-sectional area of the quantum-well layers and hence the dark current as compared to a sensor without the gap 120.

Figure 3:
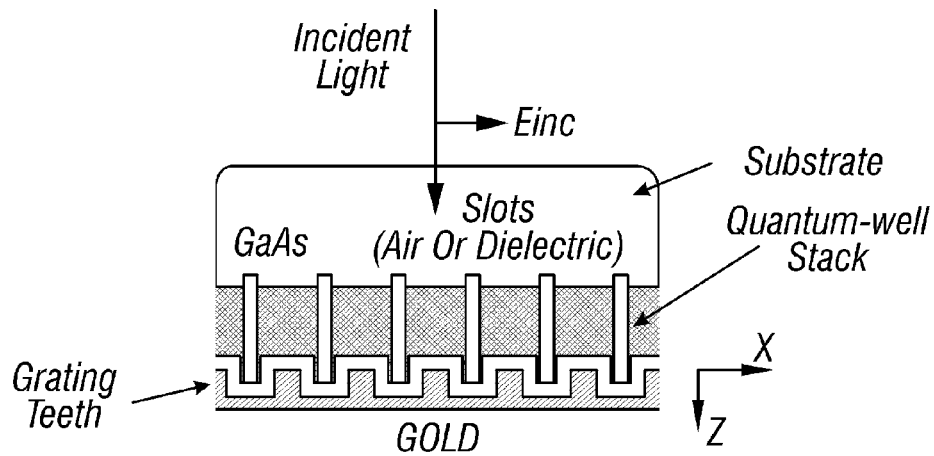
FIG. 3 shows a structure of a 1-dimensional array of quantum-well columns having grating teeth.
Figure 4:
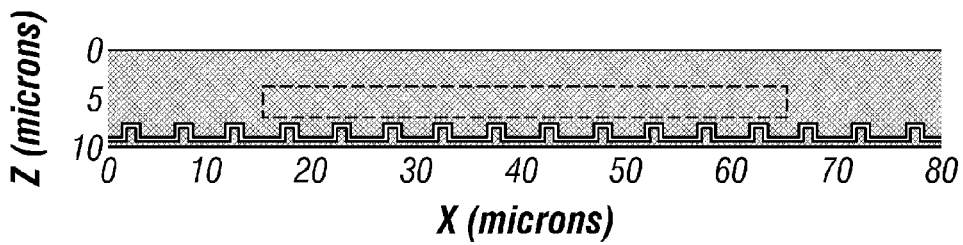
FIG. 4 shows the calculated magnitude of the coupled radiation with its electric field ($E_z$) perpendicular to the quantum-well layers for a grating-coupled quantum-well sensor similarly constructed as in FIG. 2 but without slots, where the integrated value $|E_z|^2$ is 0.0380.
Figure 5:
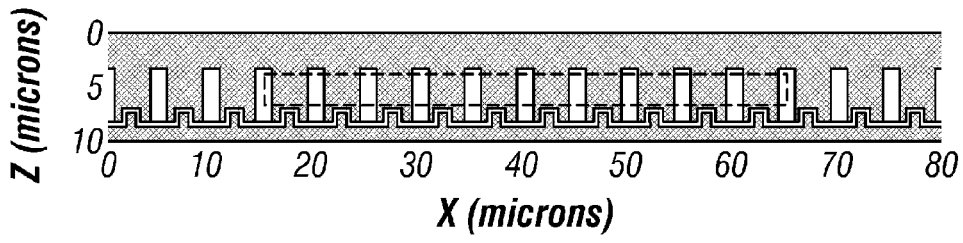
FIGS. 5 and 6 respectively show the calculated electric field ($E_z$) in the quantum-well layers for sensors with and without the grating teeth, where the integrated values for $|E_z|^2$ are 0.1143 and 0.0085, respectively.
Figure 6:
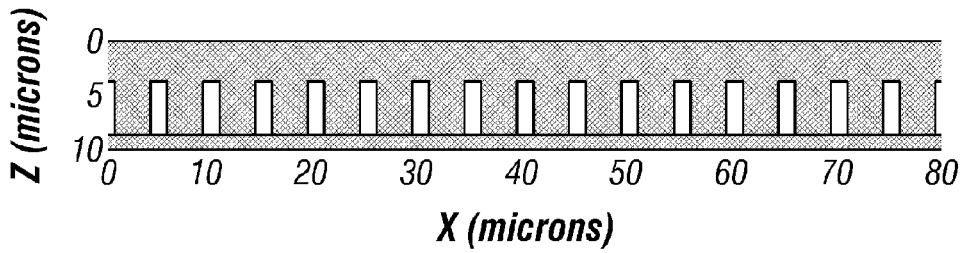

FIG. 3 shows a structure of a 1-dimensional array of quantum-well columns. FIG. 4 shows the calculated magnitude of the coupled radiation with its electric field ($E_z$) perpendicular to the quantum-well layers for a grating-coupled quantum-well sensor similarly constructed as in FIG. 2 but without slots. As a comparison, FIGS. 5 and 6 respectively show the calculated electric field ($E_z$) in the quantum-well layers for sensors with and without the grating teeth. The calculations are performed by solving a finite-difference Helmholtz equation. The calculation results suggest that the coupling efficiency of the slotted sensor shown in FIG. 5 is triple the coupling efficiency of a non-slotted sensor shown in FIG. 4 even after about 30% of the quantum-well material is removed. In addition, the presence of the grating teeth in the slotted sensor plays a significant role in achieving the excellent coupling efficiency.

Although only a few embodiments are disclosed, other embodiments, variations, and modifications are to be encompassed by the following claims.

What is claimed is:

1. A quantum-well semiconductor device that senses radiation energy, comprising:
   a substrate of a substantially transparent semiconductor material; and
   a plurality of quantum-well structures, arranged in columnar shapes and spatially separated from one another by a gap which is electrically insulating, said plurality of quantum-well structures formed over said substrate to form a periodic array as an optical grating to optically diffract light at a wavelength absorbed by said plurality of quantum-well structures,
   wherein each quantum-well structure includes, a first conductive contact layer formed over said substrate, a quantum-well stack having a plurality of alternating quantum-well layers formed in parallel over said first conductive contact layer and operating to absorb radiation polarized perpendicularly to said quantum-well layers, and a second conductive contact layer formed over said quantum-well stack, and wherein each quantum-well layer in each quantum-well structure is continuous without a void and each quantum-well structure has opposing parallel side walls perpendicular to said substrate to form an optical cavity therebetween in resonance with the wavelength.

2. The device as in claim 1, further comprising a plurality of separate metallic elements respectively formed over said plurality of quantum-well structures.

3. The device as in claim 1, wherein dimensions and indices of said plurality of quantum-well structures and respective gaps are configured to make said optical cavity in a resonance condition so that a magnitude of received radiation having a polarization perpendicular to said quantum-well layers is greater than a magnitude of received radiation having a polarization perpendicular to said quantum-well layers when the resonance condition is not met.

4. The device as in claim 1, wherein each quantum-well structure includes at least two different stacks of quantum-well layers which respectively absorb light at two different wavelengths.

5. The device as in claim 1, wherein gaps between adjacent quantum-well structures include a dielectric insulator that has an index of refraction less than an index of refraction of each quantum-well structure.

6. A quantum-well semiconductor device that senses radiation energy, comprising:
   a substrate of a substantially transparent semiconductor material; and
   a plurality of quantum-well structures in columnar shapes formed over said substrate to form a periodic array to effectuate an optical grating which diffracts light to have a component polarization perpendicular to the substrate, and spatially separated from one another by a gap which is electrically insulating, wherein each quantum-well structure has opposing parallel side walls perpendicular to said substrate to form an optical cavity therebetween,
   wherein each quantum-well structure includes, a first conductive contact layer formed over said substrate, a quantum-well stack having a plurality of quantum-well layers formed in parallel over said first conductive contact layer to absorb radiation polarized perpendicularly to said quantum-well layers, and a second con ductive contact layer formed over said quantum-well stack.

7. The device as in claim 6, further comprising a plurality of separate metallic elements respectively formed over said plurality of quantum-well structures.

8. The device as in claim 6, wherein dimensions and indices of said plurality of quantum-well structures and respective gaps are configured to make said optical cavity in a resonance condition so that a magnitude of received radiation having a polarization perpendicular to said quantum-well layers is greater than a magnitude of received radiation having a polarization perpendicular to said quantum-well layers when the resonance condition is not met.

9. The device as in claim 6, wherein each quantum-well structure includes at least two different stacks of quantum-well layers which respectively absorb light at two different wavelengths.

10. The device as in claim 6, wherein gaps between adjacent quantum-well structures include a dielectric insulator that has an index of refraction less than an index of refraction of each quantum-well structure, and wherein dimensions of each quantum-well structure are configured to form an optical cavity between two opposing side-wall surfaces in said each quantum-well structure with a resonance at a wavelength of absorbed light.

11. The device as in claim 6, wherein each quantum-well structure further included quantum well layers formed between said first conductive contact layer and said second conductive contact layer to absorb light at a wavelength different from a wavelength of light absorbed by said quantum-well stack.

* * * * *